(12) United States Patent
Uchman

(10) Patent No.: US 12,119,637 B2
(45) Date of Patent: Oct. 15, 2024

(54) MONITORING SYSTEM FOR MONITORING A SUPPLY VOLTAGE FOR AN ELECTRONIC COMPONENT

(71) Applicant: TRUMA GERAETETECHNIK GMBH & CO. KG, Putzbrunn (DE)

(72) Inventor: Sebastian Uchman, Putzbrunn (DE)

(73) Assignee: TRUMA GERAETETECHNIK GMBH & CO. KG, Putzbrunn (DE)

( * ) Notice: Subject to any disclaimer, the term of this patent is extended or adjusted under 35 U.S.C. 154(b) by 0 days.

(21) Appl. No.: 18/353,512

(22) Filed: Jul. 17, 2023

(65) Prior Publication Data

US 2024/0022063 A1 Jan. 18, 2024

Related U.S. Application Data

(63) Continuation of application No. 16/967,632, filed as application No. PCT/EP2019/052780 on Feb. 5, 2019, now Pat. No. 11,799,283.

(30) Foreign Application Priority Data

Feb. 13, 2018 (DE) ..................... 10 2018 103 127.0

(51) Int. Cl.
| | | |
|---|---|---|
| H02H 3/24 | (2006.01) | |
| F04D 27/00 | (2006.01) | |
| G01L 27/00 | (2006.01) | |
| G01R 19/165 | (2006.01) | |
| H02H 1/00 | (2006.01) | |
| H03K 5/22 | (2006.01) | |

(52) U.S. Cl.
CPC .............. *H02H 3/24* (2013.01); *F04D 27/001* (2013.01); *G01L 27/00* (2013.01);
(Continued)

(58) Field of Classification Search
CPC ......... F04D 27/001; F24F 11/30; F24F 11/32; F24F 11/38; F24F 11/46; F24F 11/49; F24F 11/63; F24F 11/88; F24F 2110/10; F24F 2120/00; G01L 27/00; G01R 19/16523; G01R 19/16547; G01R 19/16576;
(Continued)

(56) References Cited

U.S. PATENT DOCUMENTS

| 4,879,625 A | 11/1989 | Potenzone |
|---|---|---|
| 4,999,728 A | 3/1991 | Curl |

(Continued)

FOREIGN PATENT DOCUMENTS

| DE | 3813269 A1 | 11/1989 |
|---|---|---|
| DE | 102014110481 A1 | 1/2016 |

*Primary Examiner* — Jared Fureman
*Assistant Examiner* — Nicolas Bellido
(74) *Attorney, Agent, or Firm* — McNees Wallace & Nurick LLC

(57) ABSTRACT

A monitoring system for monitoring a supply voltage for an electronic component is described, comprising a voltage monitoring unit, which is configured to monitor a voltage level assigned to a supply voltage applied to the electronic component, and a switching unit which is configured to switch the electronic component on and/or off. The switching unit is coupled with the voltage monitoring unit. The switching unit is furthermore configured to switch off the electronic component if the voltage monitoring unit determines that the voltage level is below a predetermined threshold value. A mains monitoring circuit is furthermore described.

10 Claims, 5 Drawing Sheets

(52) U.S. Cl.
CPC ..... *G01R 19/16576* (2013.01); *H02H 1/0007* (2013.01); *H03K 5/22* (2013.01)

(58) Field of Classification Search
CPC .......... H02H 1/0007; H02H 3/05; H02H 3/06; H02H 3/066; H02H 3/07; H02H 3/20; H02H 3/24; H02H 3/46; H02H 3/50; H02H 5/10; H02H 7/085; H02H 7/0857; H03K 5/22
See application file for complete search history.

(56) References Cited

U.S. PATENT DOCUMENTS

| | | | | |
|---|---|---|---|---|
| 5,368,019 | A * | 11/1994 | Latorraca | F04B 49/065 128/204.21 |
| 5,784,232 | A | 7/1998 | Farr | |
| 7,355,301 | B2 | 4/2008 | Ockert et al. | |
| 9,787,244 | B2 * | 10/2017 | Sugisaki | F25B 49/025 |
| 11,799,283 | B2 * | 10/2023 | Uchman | G01R 19/16576 |
| 2004/0190211 | A1 | 9/2004 | Ockert et al. | |
| 2006/0120007 | A1 | 6/2006 | Legatti | |
| 2007/0137233 | A1 * | 6/2007 | Hatano | F25B 49/022 62/230 |
| 2010/0244563 | A1 | 9/2010 | Fleck | |
| 2013/0174601 | A1 | 7/2013 | Matsuo et al. | |
| 2015/0285529 | A1 * | 10/2015 | Li | F25B 49/005 62/126 |
| 2017/0138654 | A1 * | 5/2017 | Nakase | F25B 49/025 |
| 2022/0018563 | A1 * | 1/2022 | Liu | H02M 1/36 |

* cited by examiner

MONITORING SYSTEM FOR MONITORING A SUPPLY VOLTAGE FOR AN ELECTRONIC COMPONENT

RELATED APPLICATIONS

This application is a continuation application of U.S. application Ser. No. 16/967,632 filed on Aug. 5, 2020, which was a US national stage filing of PCT Application PCT/EP2019/052780 filed on Feb. 5, 2019, which claimed the benefit of German Application 10 2018 103 127.0 filed on Feb. 13, 2018, the entireties of which are incorporated herein by reference.

FIELD OF DISCLOSURE

The present disclosure relates to a monitoring system for monitoring a supply voltage for an electronic component, and to a mains monitoring circuit for a monitoring system.

BACKGROUND

Monitoring systems comprising a mains monitoring circuit are typically used in electronic systems to monitor the supply voltage of at least one electronic component. Such monitoring systems or mains monitoring circuits are for example used in air-conditioners to monitor the air-conditioner compressor or the supply voltage provided for the air-conditioner compressor.

In air-conditioners, it was found that short voltage dips or voltage interruptions put the air-conditioner compressor out of operation for a short time such that the latter has to be restarted against the pressure which is built up in the air-conditioning system and is not yet sufficiently reduced due the only short interruption. To this end, a correspondingly high current is required for a longer period of time. This can cause a fuse to blow and the voltage supply to be interrupted. Therefore, the entire air-conditioner is put out of operation via the fuse, which is however unnecessary as there is no safety-relevant case of fault.

The mains monitoring circuits and monitoring systems known from the prior art usually rely on a capacitor voltage to detect a voltage interruption or voltage dip if the capacitor voltage drops in a specific way. For this purpose, the capacitor voltage is compared with external reference voltages to thus be able to derive a failure criterion. Such a mains monitoring circuit is known from DE 38 13 269 A1, for example.

However, in monitoring systems and mains monitoring circuits of this type, it turned out to be disadvantageous that they comprise a complex circuit the production and implementation of which is expensive and is therefore suitable for mass products only to a limited extent.

SUMMARY

An object of the present disclosure is to provide a monitoring system and a mains monitoring circuit by means of which voltage interruptions and/or voltage dips can be detected in a simple way.

Example embodiments provides a monitoring system for monitoring a supply voltage for an electronic component, comprising a voltage monitoring unit which is configured to monitor a voltage level assigned to the supply voltage applied to the electronic component, and a switching unit which is configured to switch the electronic component on and/or off, wherein the switching unit is coupled with the voltage monitoring unit, and the switching unit is configured to switch the electronic component off if the voltage monitoring unit determines that the voltage level falls below a predetermined threshold value.

A basic idea of the present disclosure comprises the corresponding electronic component is actively switched off when the voltage level falls below the predetermined threshold value, such that a system comprising the electronic component is transferred into its initial state. The next time the system is put into operation or started, a typical initial state is then present for which the electronic component or the entire system is designed, in particular a fuse present in the system.

For example, a prolonged failure or shutdown of an air-conditioner compressor will cause the pressure in the air-conditioning system to drop sufficiently such that the air-conditioner compressor can then be started without any difficulty. To this end, the air-conditioner compressor does not require more current than usual due to the already reduced pressure, so that the fuse designed for normal operation will not blow. The fuse can thus be effectively prevented from blowing unnecessarily.

In one configuration, the electronic component is one of a plurality of electronic components of a group (system) which is supplied with the electrical voltage. In one configuration, in connection with such a group, only individual electronic components are purposefully switched off after the interruption of the voltage supply or the voltage dip has been detected. Such a group is used for cooling in larger installations such as hospitals or so-called server farms, for example.

One aspect provides that the monitoring system is configured to detect the time span during which the voltage level is below the predetermined threshold value. In this respect, the duration of the voltage interruption or voltage dip can be detected by the voltage monitoring unit. Short-term voltage dips can be bridged by the electronic component, so that it is not yet necessary to switch off the appropriate electronic component.

In particular, the switching unit is configured to switch off the electronic component if the detected time span is longer than a predetermined time span. The predetermined time span represents a tolerable interruption of the voltage supply with regard to time. The tolerable interruption depends on the characteristics of the electronic component or, for example, the corresponding machine. In this respect, the electronic component is only switched off if the voltage dip or interruption lasts longer than the predetermined time span. For example, an air-conditioner compressor can tolerate very short voltage dips, so that it would not yet be necessary to switch it off. Generally, the stability of the entire system is thus increased as it is avoided to switch off the system unnecessarily.

For example, the switching unit receives an appropriate control signal from the voltage monitoring unit if the detected voltage level falls below the predetermined threshold value. The switching unit can then determine the duration (time span) of the appropriate control signal. As soon as the time span is longer than a time span stored in a memory, i.e., longer than the predetermined time span, the switching unit switches off the electronic component.

According to a further aspect, the switching unit is configured to switch off the electronic component for a specified period of time and/or to switch on the electronic component again. The specified period of time can in turn depend on the electronic component and/or the system comprising the electronic component. The specified period of time may be a value at which it is ensured that the system comprising the electronic component is in its initial state again, so that when the electronic component is restarted, substantially such conditions exist which correspond to normal operation. In the example of the air-conditioning system, the specified period of time may be chosen such that the pressure in the air-conditioning system has sufficiently decreased so that no increased current is required to start the electronic component.

Furthermore, the switching unit is configured to switch on the electronic component again. For example, the switching unit receives an appropriate control signal from the voltage monitoring unit if the detected voltage level is again above the predetermined threshold value. The switching unit can then determine the duration (time span) of the appropriate control signal. As soon as the time span is longer than a time span stored in a memory, i.e., longer than the predetermined period of time, the switching unit switches the electronic component on again.

A further aspect provides that the voltage monitoring unit is configured to check the voltage level again after the electronic component has been switched off. The voltage level can be checked at regular intervals. If the voltage monitoring unit detects that the voltage level is above the predetermined threshold value, the voltage monitoring unit can drive the switching unit with the aim of switching the electronic component on again.

Furthermore, the voltage monitoring unit can be configured to permanently check the voltage level. As soon as the voltage level changes, this will be determined by the voltage monitoring unit accordingly.

According to one embodiment, the monitoring system comprises a sensor which monitors a system parameter of a system comprising the electronic component. The sensor may be coupled with the voltage monitoring unit and/or the switching unit so that the signal output from the sensor is processed by the voltage monitoring unit and/or the switching unit. Generally, the sensor can detect a system parameter of the system comprising the electronic component, which can be used to draw conclusions about the state of the system. Therefore, it can be determined by means of sensors whether the system comprising the electronic component is already in its initial state again, on the basis of which the electronic component can be started without a fuse blowing.

For example, the system parameter is a pressure, for example a pressure in the air-conditioning system, against which the electronic component would have to work. Such a pressure can be measured indirectly by measuring the temperature in a heat exchanger of the air-conditioning system. The temperature measurement is in particular less expensive than a direct pressure measurement. However, the significantly longer inertia of the measuring principle is disadvantageous.

In this respect, the monitoring system can be configured to determine the pressure indirectly via a temperature, in particular the pressure of a system comprising the electronic component.

In particular, the switching unit is configured to switch the electronic component on again if the system parameter detected by the sensor falls below and/or reaches a specified parameter value. The sensor can therefore be provided to drive the switching unit, which receives an appropriate signal from the voltage monitoring unit in addition to the signal from the sensor.

Using the air-conditioning system as an example, it is therefore determined whether the pressure in the air-conditioning system is below a specific level. It can thus be ensured that the electronic component, i.e. the air-conditioner compressor, can be started without increased current consumption, as the electronic component or the air-conditioner compressor does not have to work against the pressure still present.

Generally, the switching unit can be configured to switch the electronic component on again if the system parameter, for example the pressure, falls below and/or reaches a specified parameter value, i.e., a specified pressure value, and at the same time the voltage monitoring unit determines that the voltage level is above a predetermined threshold value, i.e., that sufficient voltage is available. It can thus be determined via the sensor that the (air-conditioning) system, which includes the electronic component, is back in the desired initial state, so that the electronic component can be started safely.

The initial state is thus generally a state of the system which allows the electronic component to be started safely (for example without blowing of a fuse).

Alternatively or additionally, the initial state may be considered as the state in which the system was in before the occurrence of the detected voltage interruption and/or of the identified voltage dip.

The initial state may therefore correspond to the normal operation of the system, i.e., without blowing of a fuse, without voltage interruption and/or without voltage dip.

The electronic component is for example a compressor, in particular an air-conditioner compressor. In this configuration, the focus is on an air-conditioning system having a compressor as the electronic component, the voltage supply of which is monitored by the monitoring system.

In general, the electronic component can be a motor operating against a load, in particular a mechanical load. Such an electronic motor is, for example, the aforementioned compressor, which operates against a pressure existing in the system as a (mechanical) load. In this configuration, the load in question is therefore in particular not an electronic load within the meaning of an ohmic load resistance.

The electronic motor working against a load—in particular a mechanical load—may also be referred to as loaded electronic motor.

Furthermore, the object is achieved according to example embodiments by a mains monitoring circuit for a monitoring system of the aforementioned type, which includes two mains connections for a mains voltage and a comparator, wherein the mains monitoring circuit comprises a reference voltage circuit section which generates a reference voltage applied to the comparator from the mains voltage, in particular wherein the reference voltage circuit section comprises a capacitor.

Therefore, it is possible that the mains monitoring circuit is simple in design and therefore cost-effective, as the reference voltage is generated internally via the mains monitoring circuit. Therefore, no reference is made to an external reference voltage to check for a drop in the voltage level. The reference voltage, which is generated from the mains voltage or supply voltage of the electronic component itself, and an input voltage that is assigned to the mains voltage or supply voltage are thus applied to the comparator. The input voltage is the voltage level. The voltage level can therefore be monitored via the comparator.

One aspect provides that a rectifier bridge assigned to the two mains connections is provided, the bridge outputs of which are each assigned to the reference voltage circuit section, in particular wherein a low-pass filter and/or a diode for stabilizing the rectified voltage is/are provided between a bridge output and the reference voltage circuit section. The rectifier bridge is provided for rectifying the alternating voltage applied to the two mains connections so that the rectifier bridge allows only positive half-waves to pass through. It is thus ensured that the capacitor of the reference voltage circuit section can be charged and is not discharged by negative half-waves.

The low-pass filter assigned to the reference voltage circuit section and the appropriate diode stabilize the voltage rectified by the rectifier bridge so that a stabilized rectified voltage is provided to the reference voltage circuit section in order to be able to apply an appropriately stabilized or constant reference voltage to the comparator.

In particular, the reference voltage circuit section is assigned to the negative input of the comparator. The input voltage or voltage level to be monitored can then be assigned to the positive input of the comparator. This results in a corresponding output signal of the comparator if the input voltage to be monitored changes in comparison to the reference voltage generated by the reference voltage circuit section and, in particular, becomes smaller than the reference voltage.

A further aspect provides that the mains monitoring circuit has a supply voltage circuit section for the comparator, which generates an operating voltage for the comparator from the mains voltage. In this respect, the comparator is also supplied from the mains voltage to be monitored, as a result of which an integrated operating voltage can be provided for the comparator.

An external voltage supply of the comparator is therefore not necessary.

According to a further aspect, the output of the comparator is assigned to a microcontroller and/or to an optocoupler, in particular wherein the microcontroller is assigned to a switching element in terms of control. The microcontroller can drive the switching element accordingly to switch the electronic component on or off.

The (optionally provided) optocoupler establishes a galvanic isolation. The optocoupler is for example arranged between the output of the comparator and the microcontroller, so that the microcontroller is galvanically isolated from the comparator.

Generally, the optional optocoupler permits the galvanic isolation of the mains monitoring circuit and downstream components.

In one configuration, the optocoupler is also a circuit component which serves to generate an inverted output signal of the mains monitoring circuit. The inversion refers in particular to the signal at the output of the comparator.

In a further configuration, the optocoupler generates an optical signal in the normal state, i.e., during operation without voltage dip and/or voltage interruption. In the event of a voltage dip and/or voltage interruption, this signal then goes out. The function of the optocoupler is thus ensured. Furthermore, in the event of a voltage dip and/or voltage interruption, it is not necessary to use electrical power for the signal of the optocoupler. The mains monitoring circuit is designed with the appropriate efficiency.

In an alternative configuration, the optocoupler generates a signal when a voltage dip has been detected.

Generally, the monitoring system described above for monitoring a supply voltage for an electronic component may comprise the mains monitoring circuit of the type mentioned above.

The voltage monitoring unit of the monitoring system is for example formed by the reference voltage circuit section and the comparator, in particular wherein optionally, the supply voltage circuit section is also part of the voltage monitoring unit.

The switching unit of the monitoring system can be formed by the microcontroller and the switching element, among other things. The microcontroller receives an appropriate control signal from the comparator as part of the voltage monitoring unit if the voltage level falls below the predetermined threshold value determined by the reference voltage.

The optionally provided optocoupler can therefore provide a galvanic isolation between the voltage monitoring unit and the switching unit, provided that the optocoupler is arranged between the output of the comparator and the microcontroller.

BRIEF DESCRIPTION OF DRAWINGS

Further advantages and characteristics of example embodiments will become apparent from the description below and from the drawings to which reference is made and in which.

DETAILED DESCRIPTION OF EXAMPLE EMBODIMENTS

Figure 1:
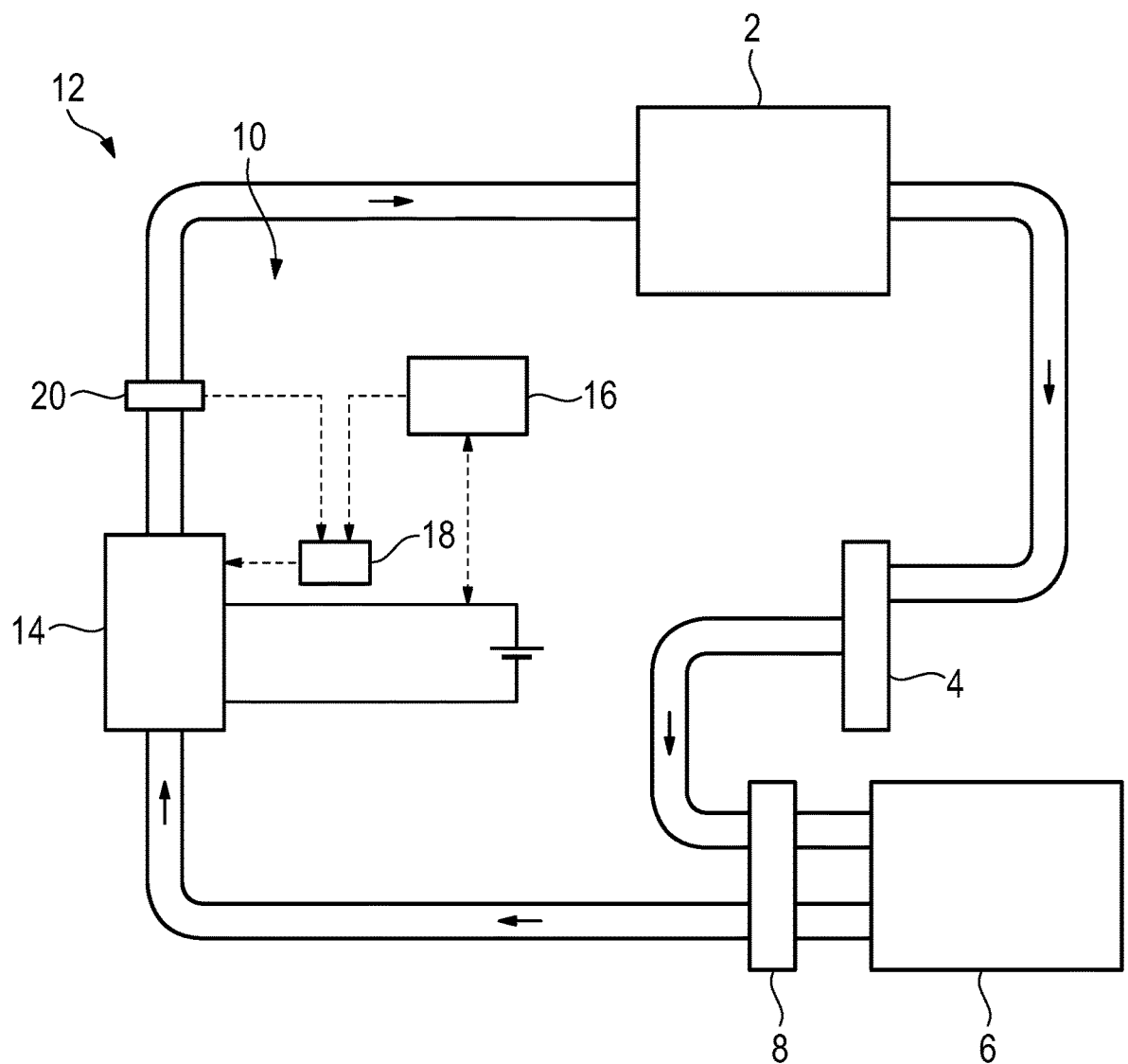
FIG. 1 shows a schematic representation of a monitoring system according to example embodiments in an air-conditioning system.

FIG. 1 schematically shows a monitoring system 10 provided for monitoring a supply voltage. An electronic component 14 present in a system 12 is operated via the supply voltage.

In the embodiment shown, the monitoring system 10 is assigned to a system 12 designed as an air-conditioning system, which is shown only schematically in its essential features. In the representation, the monitoring system 10 monitors the supply voltage of an electronic component 14 designed as an air-conditioner compressor.

All in all, the electronic component 14 configured as an air-conditioner compressor, a condenser 2, a dryer 4, an evaporator 6, an expansion device 8, form a cooling circuit that implements the cooling function of the system 12, which is designed as an air-conditioning system.

To this end, the monitoring system 10 comprises a voltage monitoring unit 16 which is configured to monitor a voltage level assigned to the supply voltage applied to the electronic component 14, i.e., the air-conditioner compressor.

The monitoring system 10 also includes a switching unit 18, which is configured to switch the electronic component 14, i.e., the air-conditioner compressor, on or off. The switching unit 18 switches the electronic component 14 off, in particular when the voltage monitoring unit 16 determines that the voltage level falls below a predetermined threshold value.

For this purpose, the switching unit 18 is coupled with the voltage monitoring unit 16 in terms of control so that the switching unit 18 can receive a control signal of the control monitoring unit 16.

In the embodiment shown, the monitoring system 10 additionally comprises a sensor 20 which monitors a system parameter of the system 12, i.e., of the air-conditioning system.

In the embodiment shown, the system parameter may be a pressure. The system parameter detected by the sensor 20 is transmitted to the switching unit 18 which thus receives a signal from the voltage monitoring unit 16 and a signal from the pressure sensor 20.

The pressure can also be determined by the monitoring system 10 indirectly via a temperature.

Generally, the switching unit 18 is configured to switch the electronic component 14 on or off, which is carried out depending on the received signals, as will be explained in more detail below.

As already explained, the electronic component 14 is switched off by the switching unit 18 if the voltage level has fallen below the predetermined threshold value.

Similarly, the electronic component 14 is switched on by the switching unit 18 if the voltage level has increased above a predetermined threshold value and—depending on the configuration—the system parameter, for example, reaches a suitable value and/or a sufficient large time has elapsed after the switching off.

If the monitoring system 10, as is the case in the embodiment shown, comprises the sensor 20 which monitors a system parameter, the switching unit 18 additionally takes the detected system parameter into account.

For example, the pressure in the air-conditioning system 12 should fall below and/or should have reached a specified pressure value before the switching unit 18 switches the electronic component 14 on again. This is carried out to ensure that the electronic component 14, i.e., the air-conditioner compressor does not have to operate against the pressure still present in the air-conditioning system 12, which would result to a high current consumption.

Generally, the switching unit 18 is configured to switch off the electronic component 14 only if the voltage level falls below the predetermined threshold value for a certain time. This means that the monitoring system 10 is configured to detect the time span during which the voltage level is below the predetermined threshold value. If the time span is longer than a predetermined time span, the switching unit 18 switches the electronic component 14 off. It is thus ensured that short-time voltage dips which the system 12, in particular the electronic component 14, can tolerate, do not lead to the switching off of the corresponding electronic component 14. The system stability is therefore increased.

Furthermore, the switching unit 18 is configured to switch off the electronic component 14 for a specified period of time so that the electronic component 14 is (automatically) switched on again only after the specified period of time has elapsed. This is intended to ensure that the system 12 can return in its initial state as is the case during normal operation. More specifically, the pressure present in the system 12 is to be reduced so that the electronic component 14 does not have to be started against this pressure.

Alternatively or additionally, it may be provided that the switching unit 18 does not switch the electronic component 14 on again until it receives an appropriate control signal, for example from the voltage monitoring unit 16 and/or from the sensor 20.

If the appropriate control signal is output by the voltage monitoring unit 16 already before the specified period of time has elapsed, it may be provided that the specified period of time is waited for first.

If an appropriate control signal is output by the sensor 20, the electronic component 14 can be directly restarted as the desired initial state of the system 12 should have been restored.

Generally, the voltage monitoring unit 16 is configured to check the voltage level again after the electronic component 14 has been switched off. The voltage monitoring unit 16 monitors the voltage level continuously.

The electronic component 14 is not switched on again before the voltage level is above the predetermined threshold value.

Figure 2:
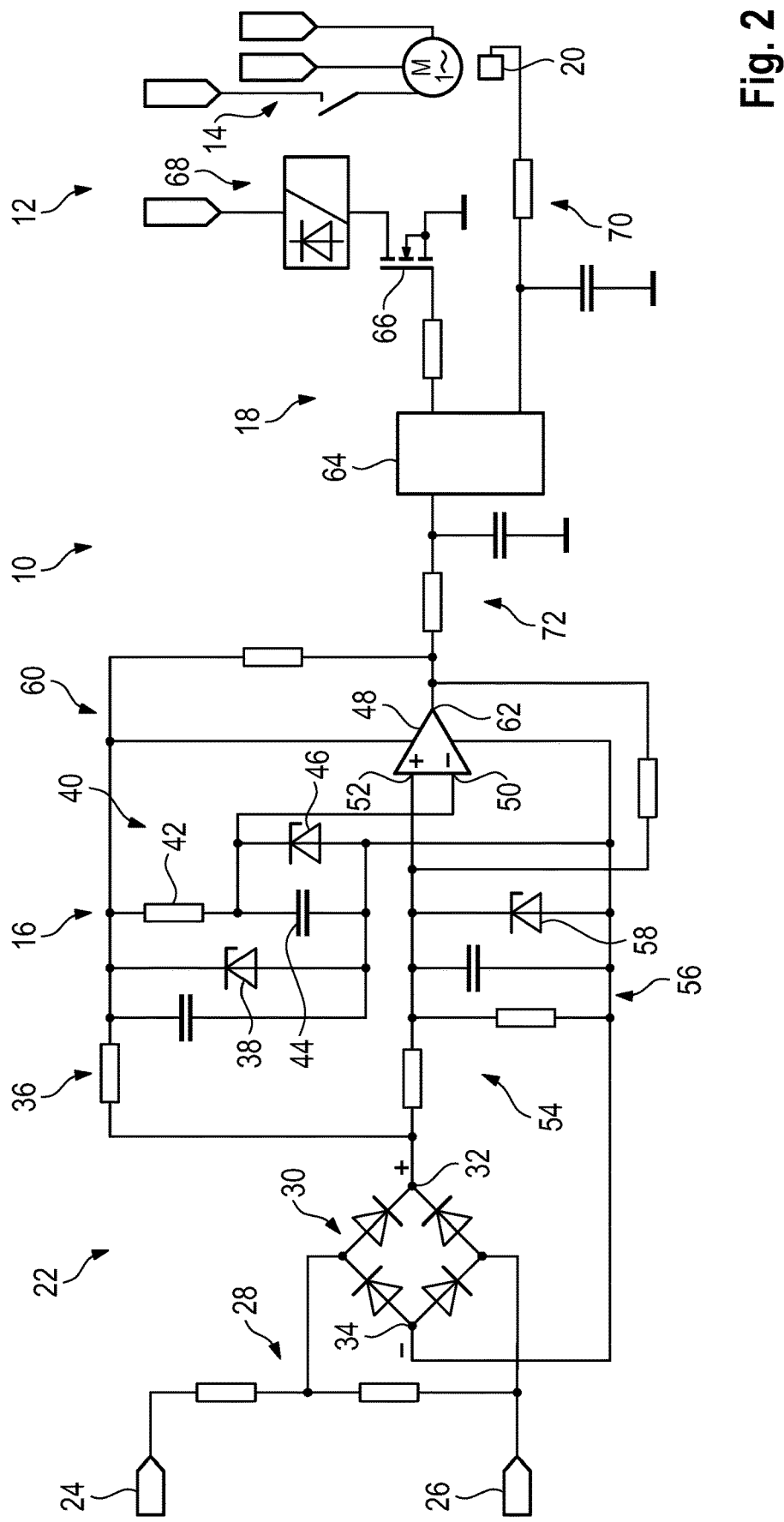
FIG. 2 shows a circuit diagram of a monitoring system according to example embodiments.

FIG. 2 illustrates the monitoring system 10 on the basis of a circuit diagram which shows the structure of the mains monitoring circuit 22 of the monitoring system 10. The monitoring system 10 thus comprises the mains monitoring circuit 22.

The mains monitoring circuit 22 includes two mains connections 24, 26 to which the mains voltage for the electronic component 14 is applied.

The mains voltage to be monitored is first converted to a voltage level which ensures that the remaining components of the mains monitoring circuit 22 remain undamaged by means of a voltage divider 28 which includes two ohmic resistors. In this respect, the mains voltage to be monitored and the voltage level are linked to or associated with each other.

A rectifier bridge 30 adjoins the voltage divider 28 and is thus assigned to the two mains connections 24, 26. The rectifier bridge 30 ensures that no negative voltages have to be processed by the mains monitoring circuit 22, as only positive half-waves are allowed to pass.

The rectifier bridge 30 includes two bridge outputs 32, 34 so that a rectified voltage is output.

A first low-pass filter 36 and a diode 38 for stabilizing the rectified voltage are assigned to the first bridge output 32.

The stabilized and rectified voltage is then provided for a reference voltage circuit section 40 which generates and provides a reference voltage, as will be explained below.

The reference voltage circuit section 40 comprises a resistance 42, a capacitor 44 and a diode 46 connected in parallel to the capacitor 44. In the illustrated embodiment, the diode 46 is in particular a Zener diode. The components of the reference voltage circuit section 40 are assigned to the outputs 32, 34 of the rectifier bridge 30. The rectifier bridge 30 is in turn coupled with the mains voltage to be monitored, such that the reference voltage is generated from the mains voltage to be monitored. In this respect, the reference voltage circuit section 40 may also be referred to as integrated reference voltage source.

The reference voltage circuit section 40 is adjoined by a comparator 48 to which the reference voltage generated by the reference voltage circuit section 40 is applied correspondingly, more specifically to the negative input 50 of the comparator 48.

In contrast thereto, the positive input 52 of the comparator 48 is assigned to the voltage level to be monitored.

The positive half-waves which are generated by the rectifier bridge 30 and are supplied to the positive input 52 of the comparator 48, are also appropriately processed by a voltage divider 54 which includes two resistors, and by a low-pass filter 56 and a diode 58 (which is a Zener diode in the illustrated example embodiment), so that an overvoltage protection is ensured.

Furthermore, the mains monitoring circuit 22 comprises a supply voltage circuit section 60 which, among other things, generates an operating voltage for the comparator 48 from the mains voltage to be monitored, so that the comparator 48 is operated via the mains voltage to be monitored.

In the embodiment shown, the output 62 of the comparator 48 is assigned to a microcontroller 64 via which a switching element 66 configured as a transistor in the configuration shown is driven.

The switching element 66, i.e., the transistor, controls the electronic component 14 accordingly via a relay 68, such that the electronic component 14 is switched on or off.

Furthermore, the microcontroller 64 is coupled with the sensor 20 such that the system parameter detected by the sensor 20 is also transmitted to the microcontroller 64.

The signal output by the sensor 20 is forwarded to the microcontroller 64 in a filtered manner via a low-pass filter 70.

Similarly, a low-pass filter 72 may be provided between the comparator 48 and the microcontroller 64.

In this respect, the monitoring system 10 for monitoring a supply voltage for an electronic component 14 comprises the mains monitoring circuit 22.

In the embodiment shown, the voltage monitoring unit 16 can be formed through the components of the mains monitoring circuit 22 up to the output 62 of the comparator 48, i.e., through the comparator 48 and the reference voltage circuit section 40. In contrast thereto, the switching unit 18 of the monitoring system 10 is formed by the microcontroller 64 and the assigned switching element 66, via which the voltage supply of the electronic component 14 can be switched on or off.

To this end, the switching unit 18, in particular the microcontroller 64, receives a control signal from the comparator 48 and also from the sensor 20, on the basis of which the microcontroller 64 drives the assigned switching element 66 accordingly.

Figure 3:
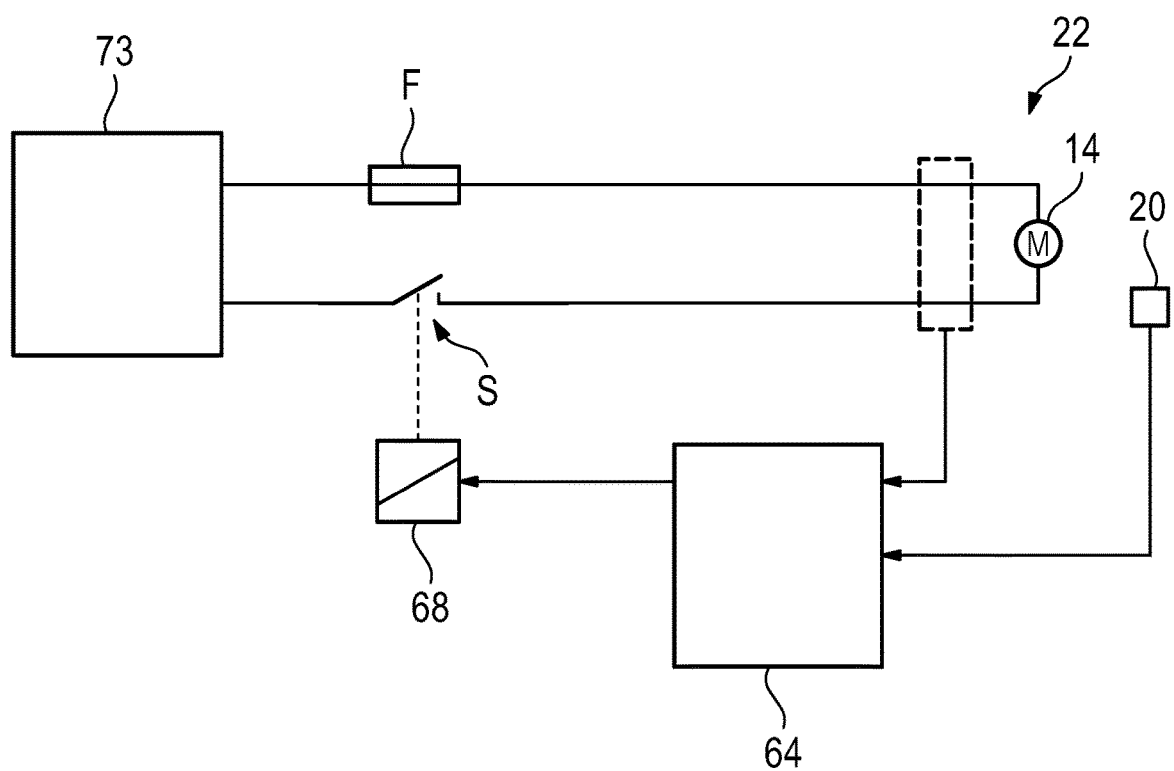
FIG. 3 shows a schematic representation of a monitoring system according to example embodiments in any electronic component.

FIG. 3 shows a schematic representation of a general use of the monitoring system 22, the electronic component 14 being a motor of any type.

The electronic component 14 is supplied with an electrical voltage by an electrical mains supply 73. Furthermore, a fuse F and a switch S which is here controlled by the relay 68, as will be explained below, are present.

The mains monitoring circuit 22 monitors the voltage supplied via the electrical mains supply 73, as is schematically shown in FIG. 3, and, in case of a voltage dip an/or a voltage interruption, transmits a signal to a control logic which is here configured as the microcontroller 64 by way of example.

In case of a dropping below the reference voltage beyond the specified period of time, the switch S is opened by the microcontroller 64 via the relay 68, and thus the voltage supply of the electronic component 14 is interrupted. For switching the electronic component 14 on, i.e., for the new closing of the switch S, the microcontroller 64 is here connected to the sensor 20 which provides a statement concerning the system parameter.

Alternatively or additionally, the time is also awaited during which the electronic component 14 should be switched off, so that the initial state is restored. By taking the system parameter and/or the duration of being switched-off, i.e., the duration of the switched-off state into account, it is assumed that the voltage level required by the electronic component 14 for restarting falls below the level, which cause the fuse F to blow, within a tolerable time, and/or that the required current demand does not remain at such a high level so long that the fuse F would blow.

Figure 4:
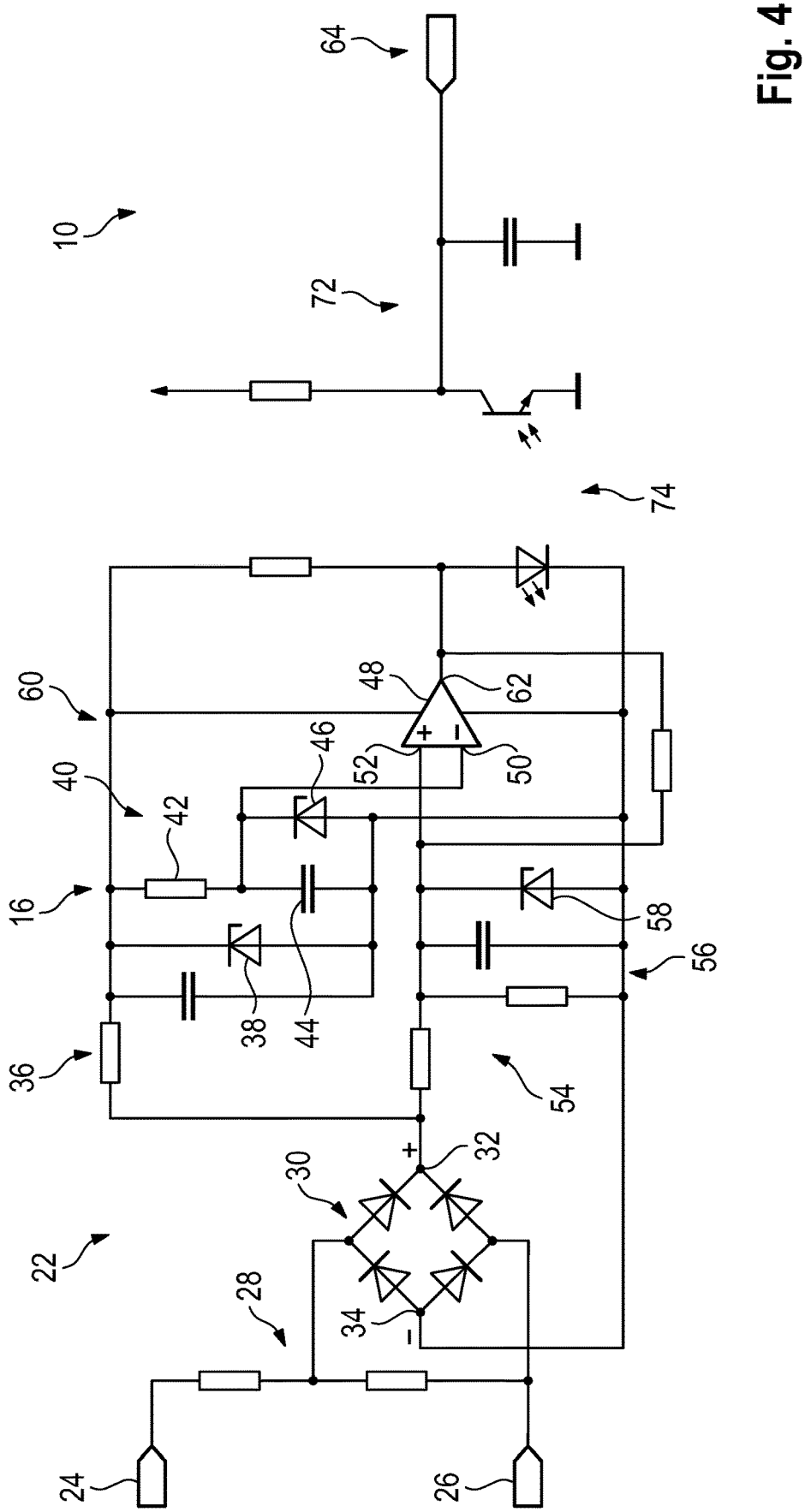
FIG. 4 shows a circuit diagram of a mains monitoring circuit according to example embodiments in one embodiment, which is provided for a monitoring system according to example embodiments.

FIG. 4 shows an alternative embodiment of the mains monitoring circuit 22 in which in addition to the embodiment shown in FIG. 2, an optocoupler 74 is provided which is arranged between the output 62 of the comparator 48 and the microcontroller 64 to provide a galvanic isolation. In this respect, the optocoupler 74 provides a galvanic isolation of the voltage monitoring unit 16 and the switching unit 18 of the monitoring system 10.

Figure 5:
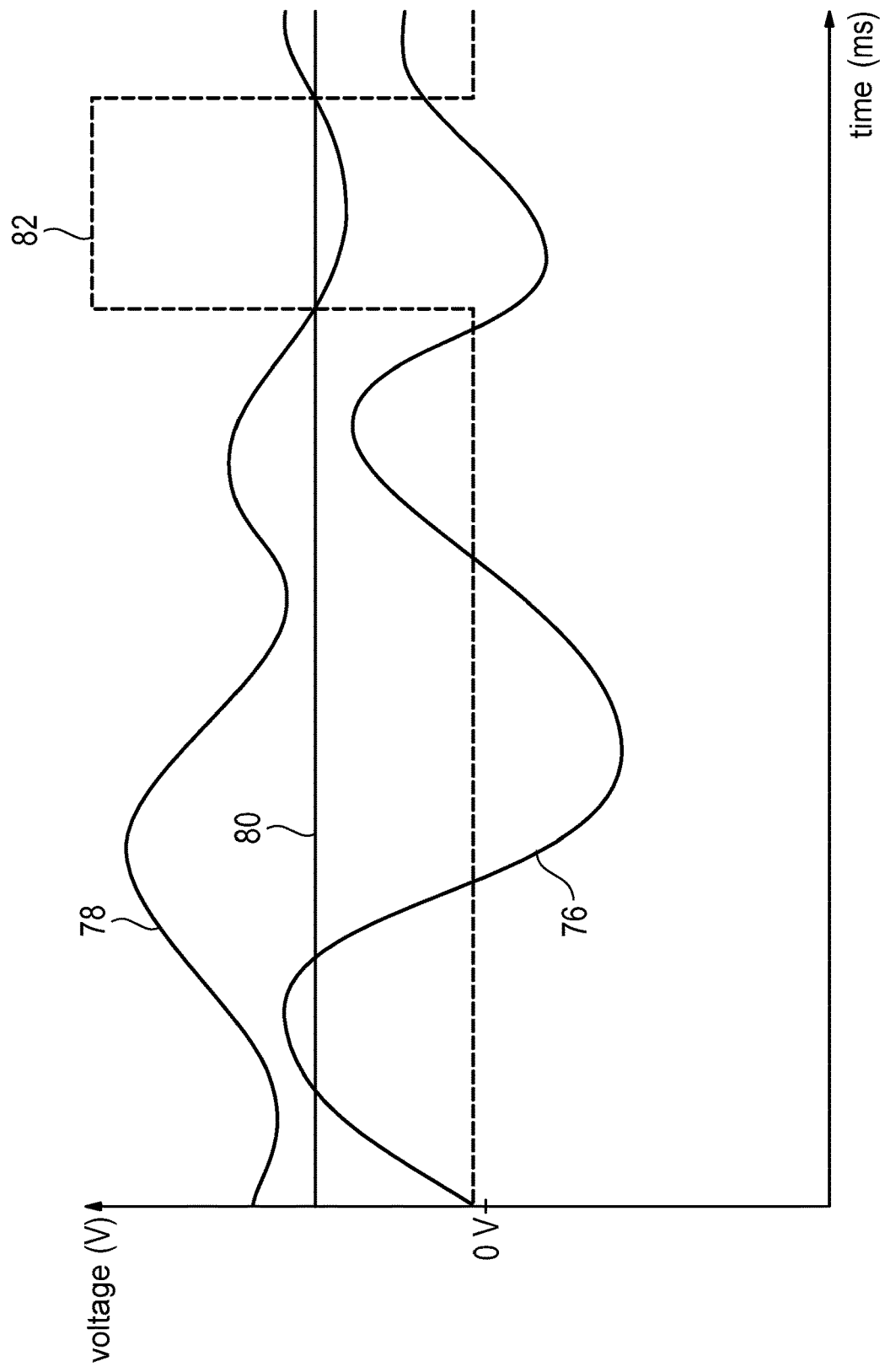
FIG. 5 shows a diagram showing the occurring voltages.

FIG. 5 shows an exemplary diagram showing the voltages processed by means of the monitoring system 10 or the mains monitoring circuit 22. The circuit of FIG. 4 is considered here, in which an inversion of the signal of the comparator 48 is achieved due to the optocoupler 74 used, in contrast to the circuit of FIG. 2.

A supply voltage 76 provided as an alternating voltage is shown, which results in a voltage level 78 which is applied to the positive input 52 of the comparator 48 and is compared with the reference voltage 80 generated from the supply voltage 76, which represents the predetermined threshold value and is applied to the negative input 50 of the comparator 48.

FIG. 5 shows that the supply voltage 76 decreases over the time as a result of which the voltage level 78 also decreases.

As soon as the voltage level 78 falls below the reference voltage 80 or the predetermined threshold value, the output voltage 82 at the output 62 of the comparator 48, i.e., the output signal thereof changes, such that the signal 82 is produced behind the optocoupler 74 and thus for the microcontroller 64. As a result of this and the inversion due to the optocoupler 74, a control signal is output which is supplied to the microcontroller 64.

The microcontroller 64 can then be configured to detect the time span, how long the voltage level 78 is below the predetermined threshold value 80, in that the microcontroller 64 measures how long it receives the "high signal" of the mains monitoring circuit 22—i.e., the inverted signal of the comparator 48.

If the detected time span is longer than a predetermined time span stored in the microcontroller 64, the microcontroller 64 controls the assigned switching element 66 to switch out the electronic component 14.

Furthermore, the microcontroller 64 can be configured to as to maintain the electronic component 14 in the switched-off state for a specified period of time which is also stored in the microcontroller 64, even if a "low signal" is again output by the mains monitoring circuit 22. The microcontroller 64 does not control the switching element 66 again before the specified period of time has elapsed.

Furthermore, the microcontroller 64 can receive the corresponding signal from the sensor 20, on the basis of which the microcontroller 64 drives the switching element 66 to switch the electronic component 14 on again.

The comparator 48 and thus the voltage monitoring unit 16 continuously monitors the voltage level 78, as can be seen from the diagram of FIG. 5, so that it is immediately recognized when the voltage level 78 is below or above the predetermined threshold value or the constant reference voltage 80.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A monitoring system for monitoring a supply voltage for an electronic component, comprising:
   a voltage monitoring unit which is configured to monitor a voltage level assigned to the supply voltage applied to the electronic component, and
   a switching unit which is configured to switch the electronic component ON and/or OFF,
   wherein the switching unit is coupled with the voltage monitoring unit,
   wherein the switching unit is configured to switch the electronic component OFF when the voltage monitoring unit determines that the voltage level is below a predetermined threshold value,
   wherein the monitoring system includes a sensor which monitors a pressure of a system having the electronic component, and
   wherein the switching unit is configured to switch the electronic component ON again when the system parameter detected by the sensor falls below and/or reaches a specified parameter value; and
   a mains monitoring circuit for a monitoring system including two mains connections for a mains voltage, and a comparator,
   wherein the mains monitoring circuit includes a reference voltage circuit section which generates a reference voltage applied to the comparator from the mains voltage,
   wherein the reference voltage circuit section includes a capacitor,
   wherein the output of the comparator is assigned to a microcontroller and/or to an optocoupler, and
   wherein the microcontroller is assigned to a switching element in terms of control.

2. The monitoring system according to claim 1, wherein the monitoring system is configured to detect the time span during which the voltage level is below the predetermined threshold value.

3. The monitoring system according to claim 1, wherein the switching unit is configured to switch OFF the electronic component when the detected time span is longer than a predetermined time span.

4. The monitoring system according to claim 1, wherein the switching unit is configured to switch OFF the electronic component for a specified period of time and/or to switch the electronic component ON again.

5. The monitoring system according to claim 1, wherein the voltage monitoring unit is configured to check the voltage level again after the switching OFF of the electronic component.

6. The monitoring system according to claim 1, wherein the monitoring system is configured to indirectly identify the pressure via a temperature.

7. The monitoring system according to claim 1, wherein the electronic component is a compressor working against a load, a mechanical load, and is an air-conditioner compressor.

8. The monitoring system according to claim 1, wherein a rectifier bridge assigned to the two mains connections is provided, the bridge outputs of which are each assigned to the reference voltage circuit section, wherein a low-pass filter and/or a diode for stabilizing the rectified voltage is/are provided between a bridge output and the reference voltage circuit section.

9. The monitoring system according to claim 1, wherein the mains monitoring circuit includes a supply voltage circuit section for the comparator which generates an operating voltage for the comparator from the mains voltage.

10. A monitoring system for monitoring a supply voltage for an electronic component, comprising:
    a voltage monitoring unit which is configured to monitor a voltage level assigned to the supply voltage applied to the electronic component, and
    a switching unit which is configured to switch the electronic component ON and/or OFF,
    wherein the switching unit is coupled with the voltage monitoring unit,
    wherein the switching unit is configured to switch the electronic component OFF when the voltage monitoring unit determines that the voltage level is below a predetermined threshold value,
    wherein the monitoring system includes a sensor which monitors a pressure of a system having the electronic component, and
    wherein the switching unit is configured to switch the electronic component ON again when the system parameter detected by the sensor falls below and/or reaches a specified parameter value; and
    a mains monitoring circuit including two mains connections for a mains voltage, and a comparator,
    wherein the mains monitoring circuit includes a reference voltage circuit section which generates a reference voltage applied to the comparator from the mains voltage,
    wherein the reference voltage circuit section includes a capacitor,
    wherein the comparator has a first input to which a reference voltage is applied and a second input to which a voltage to be monitored is applied, and/or
    wherein the reference voltage is generated internally via the monitoring circuit.

* * * * *